(12) United States Patent
Shafer (10) Patent No.: US 8,670,730 B2
(45) Date of Patent: Mar. 11, 2014

(54) POWER EFFICIENT RADIO FREQUENCY TRANSMITTER

(75) Inventor: Thomas Ogle Shafer, Seattle, WA (US)

(73) Assignee: Spectralux Corporation, Redmond, WA (US)

( * ) Notice: Subject to any disclaimer, the term of this patent is extended or adjusted under 35 U.S.C. 154(b) by 157 days.

(21) Appl. No.: 13/216,861

(22) Filed: Aug. 24, 2011

(65) Prior Publication Data

US 2013/0049854 A1 Feb. 28, 2013

(51) Int. Cl.
*H04B 1/04* (2006.01)
*H04K 1/02* (2006.01)
*H03G 3/20* (2006.01)

(52) U.S. Cl.
USPC .......... 455/126; 455/127.3; 375/297; 330/96; 330/260

(58) Field of Classification Search
USPC ......... 455/126, 127.1, 127.2, 127.3; 375/296, 375/297; 330/75, 96, 97, 250, 259, 260, 330/261
See application file for complete search history.

(56) References Cited

U.S. PATENT DOCUMENTS

| | | | | |
|---|---|---|---|---|
| 5,467,055 A | * | 11/1995 | Wray et al. | 330/129 |
| 6,448,616 B1 | * | 9/2002 | Perugupalli et al. | 257/379 |
| 6,731,694 B2 | * | 5/2004 | Bozeki et al. | 375/297 |
| 7,095,988 B2 | * | 8/2006 | Ben-Ayun et al. | 455/126 |
| 7,486,144 B2 | | 2/2009 | Mitzlaff et al. | |
| 7,995,977 B2 | * | 8/2011 | Kim et al. | 455/127.2 |

* cited by examiner

*Primary Examiner* — Quochien B Vuong
(74) *Attorney, Agent, or Firm* — Davis Wright Tremaine LLP; George C. Rondeau, Jr.

(57) ABSTRACT

A power efficient, small-packaged radio frequency (RF) transmitter for use in avionics applications. The RF transmitter utilizes Cartesian feedback to operate a power amplifier with Class AB biasing and efficiency, while delivering Class A biasing performance. The RF transmitter includes interstage pads and high pass filters specially configured to meet demanding requirements for both adjacent channel power (ACP) limits and wideband spurious energy limits. The RF transmitter is much smaller in size and dissipates less DC power and heat than previous RF transmitters used in avionics applications.

23 Claims, 7 Drawing Sheets

POWER EFFICIENT RADIO FREQUENCY TRANSMITTER

BACKGROUND OF THE INVENTION

1. Field of the Invention

The present invention is directed generally to radio frequency (RF) transmitters and more particularly to power-efficient, small-packaged RF transmitters that have high gain, high power, and are required to be spectrally efficient.

2. Description of the Related Art

Figure 1:
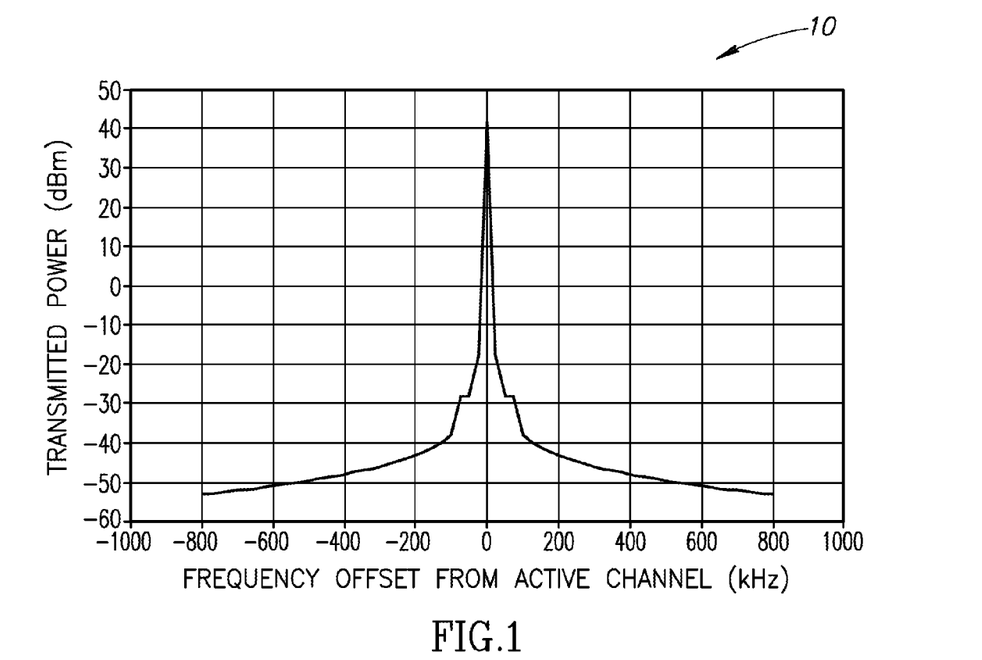
FIG. 1 is a graph illustrating the spectral mask requirement for the VDL Mode 2 application as specified in the Minimum Operational Performance Standards (MOPS) and Test Procedures for Aircraft VDL Mode 2.

Radio frequency (RF) transmitters used for avionics applications, such as the VHF Data Link (VDL) Mode 2 application, are required to transmit at a high power with a high degree of spectral purity (also referred to as "spectral efficiency"). This means that they should transmit on-channel, with very little bleed-over of energy into adjacent channels. FIG. 1 is a graph 10 illustrating the spectral mask requirement for the VDL Mode 2 application as specified in the Minimum Operational Performance Standards (MOPS) and Test Procedures for Aircraft Very High Frequency (VHF) Digital Link (VDL) Mode 2 (DO#: DO-281A), hereinafter referred to as the "avionics specification" or simply the "specification." The channel spacing for VDL Mode 2 is 25 kHz. This specification requires the active channel signal power to be a minimum of 15 watts with a minimum of 40 dB, up to 95 dB of suppression in the adjacent channels. Table 1 below shows a subset of the spectral mask requirements for adjacent channel power (ACP) according to the specification.

TABLE 1

VDL Mode 2 Transmitter Adjacent Channel Power Requirements

| Frequency Offset | Power (dBm)/25 kHz | Power (dBc)/25 kHz |
| --- | --- | --- |
| On-channel | >+42 | n/a |
| +/−25 kHz | <+2 | <−40 |
| +/−50 kHz | <−28 | <−70 |
| +/−75 kHz | <−28 | <−70 |
| +/−100 kHz | <−38 | <−80 |
| +/−300 kHz | <−46 | <−88 |
| +/−500 kHz | <−49.6 | <−91.6 |
| +/−800 kHz | <−53 | <−95 |

The traditional solution to meet the spectral purity requirement has been to design a "Class A" transmitter architecture. Such as design is characterized by amplifiers that are biased in their linear region of operation. Although transmitters operating in a Class A configuration can have high spectral purity, their efficiency is very low. Typically, amplifiers operating as a Class A amplifier require a direct current (DC) bias that results in only about a 5% to 10% power efficiency. As an example, a Class A amplifier operating with an 8% efficiency that is required to deliver 15 watts of RF output power would require 187.5 watts of DC power (15 watts/0.08), and would dissipate 172.5 watts as heat.

DETAILED DESCRIPTION OF THE INVENTION

The present invention is directed to power efficient, small-packaged RF transmitters for use with avionics applications. The transmitters of the present invention use Cartesian feedback to "linearize" the transmitted signal so that its spectral purity is very high (e.g., meets the spectral mask requirements for avionics applications) compared to open loop systems. The RF transmitters disclosed herein use power amplifiers and driver amplifiers which are operated with Class AB biasing, which results in a relatively low DC power consumption and low power dissipation as heat. These features permit the RF transmitters to utilize smaller components and a smaller circuit board, which is advantageous in avionics applications where the amount of space (or volume) available is often limited.

Figure 2:
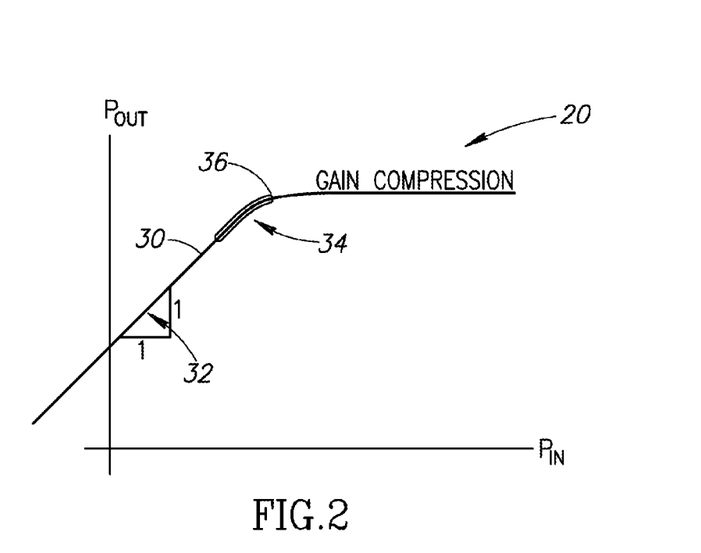
FIG. 2 is a graph illustrating a gain characteristic for a typical amplifier used in an RF transmitter, showing various operating regions.

FIG. 2 is a graph 20 illustrating a typical gain characteristic curve 30 of an amplifier suitable for use in an RF transmitter. In the Class A region 32 of operation, an amplifier is said to be "linear" which means (1) the output power increases 1:1 with the input power, and (2) the amplifier produces little spectral noise and spurious signals. When an amplifier is operated in its Class AB region 34, it is starting to go into a gain compression region 36. With respect to DC power requirements, the Class AB region 34 is much more efficient than the Class A region 32 because, unlike amplifiers operating in the Class A region, amplifiers operating in the Class AB region do not conduct current for the full 360 degrees of an input waveform. However, amplifiers operating in the Class AB region 34 also produce much more undesirable sideband energy. For this reason, applications requiring little spectral noise, such as avionics applications, typically provide amplifiers operating in the Class A region 32. However, when an amplifier is biased to operate as a Class AB amplifier, its efficiency may be much better than when operating as a Class A amplifier (e.g., closer to 30% instead of 5-10%). For example, if 15 watts of RF output power are desired, an amplifier operating as a Class AB amplifier operating at 30% efficiency requires only 50 watts of DC power (as opposed to 187.5 watts of DC power for the Class A amplifier) and dissipates only 35 watts (50−15=35 watts) as heat. In general, a reduced DC power consumption requirement improves heat dissipation, reduces the space required to implement a power amplifier, reduces weight, and lowers cost.

Figure 3:
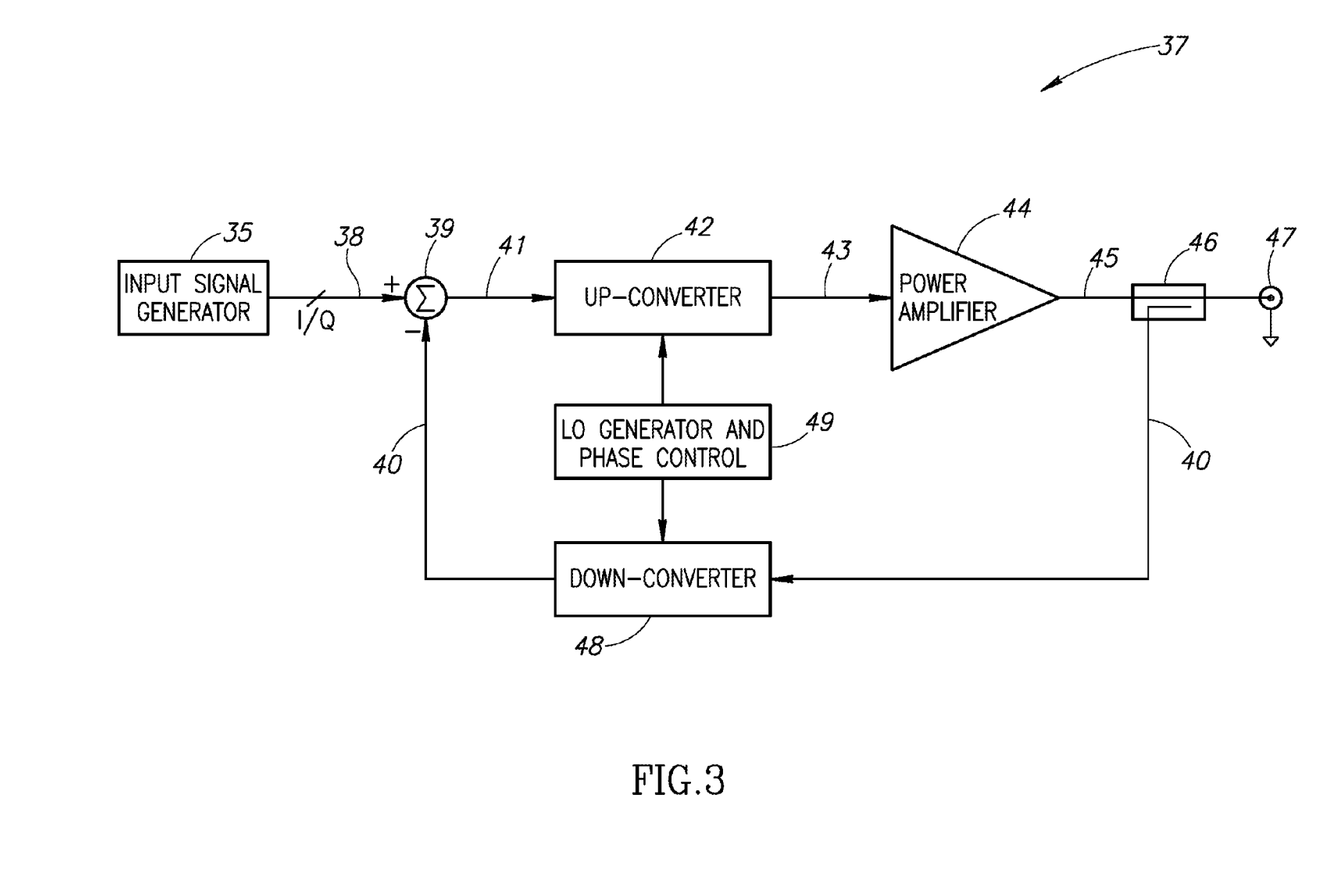
FIG. 3 is a block diagram of an RF transmitter implementing a Cartesian Feedback Loop (CFBL).

As discussed above, the RF transmitters of the present invention utilize Cartesian feedback to provide transmitters that have high spectral purity while dissipating a low amount of DC power (and heat). A simplified block diagram of an RF transmitter 37 that utilizes Cartesian feedback is shown in FIG. 3.

In general, a Cartesian feedback loop operates to improve the linearity of a power amplifier device by the action of feedback. As shown in FIG. 3, an input signal 38 is provided in Cartesian format (i.e., in-phase and quadrature (I/Q) format). The input signal 38 may be received from an input signal generator 35 (e.g., a modulator) of the RF transmitter 37. The input signal 38 is applied to an error amplifier 39 (or "summing amplifier") where it is compared to a feedback signal 40. The output 41 of the error amplifier 39 may be applied to an up-converter 42 (or "up-mixer") to generate an RF signal 43 that is then amplified by a power amplifier 44. A sample of the output 45 of the power amplifier 44 is taken using a directional coupler 46 as the feedback signal. The directional coupler 46 is positioned after the power amplifier 44 and prior to an antenna port 47. The feedback signal 40 is applied to a down-converter 48 and then applied to the error amplifier 39 as described above. This forms the closed-loop system, such that as long as the feedback path does not introduce distortion, the system will attempt to correct the signal at the output 45 to match the I/Q input signal 38 applied to the error amplifier 39. As shown, the RF transmitter 37 also includes local oscillator (LO) generator and phase control circuitry 49 configured to supply appropriate RF signals to the up-converter 42 and the down-converter 48.

In the embodiments described herein, Cartesian feedback has been implemented within a highly integrated "system on chip" (SoC) integrated circuit, the CMX998, designed and manufactured by CML Microsystems Plc. In other embodiments, various other components may be used to provide Cartesian feedback. The CMX998 was developed for the low-power telecommunications market (e.g., cellular phones), which uses radios with lower transmitted power and lower system gain than radios required for avionics applications. In addition to lower transmitted power and lower system gain requirements, the spectral purity requirements in telecommunications applications are not nearly as demanding as they are in avionics applications.

An examination of some design calculations illustrates the benefits of operating an amplifier in its Class AB region to facilitate size reduction. The VHF Data Link (VDL) Mode 2 application employs differential 8-Phase-Shift Keying modulation. This modulation is characterized by a crest factor (peak-to-average power ratio) of approximately 5 dB, which means that its peak power is 5 dB greater than its average power. Since the aforementioned specification (DO-281A) requires a minimum average power of 15 watts (+41.8 dBm), the peak power must be at least 5 dB greater than 41.8 dBm (i.e., at least 46.8 dBm), or 47.9 watts.

Figure 4:
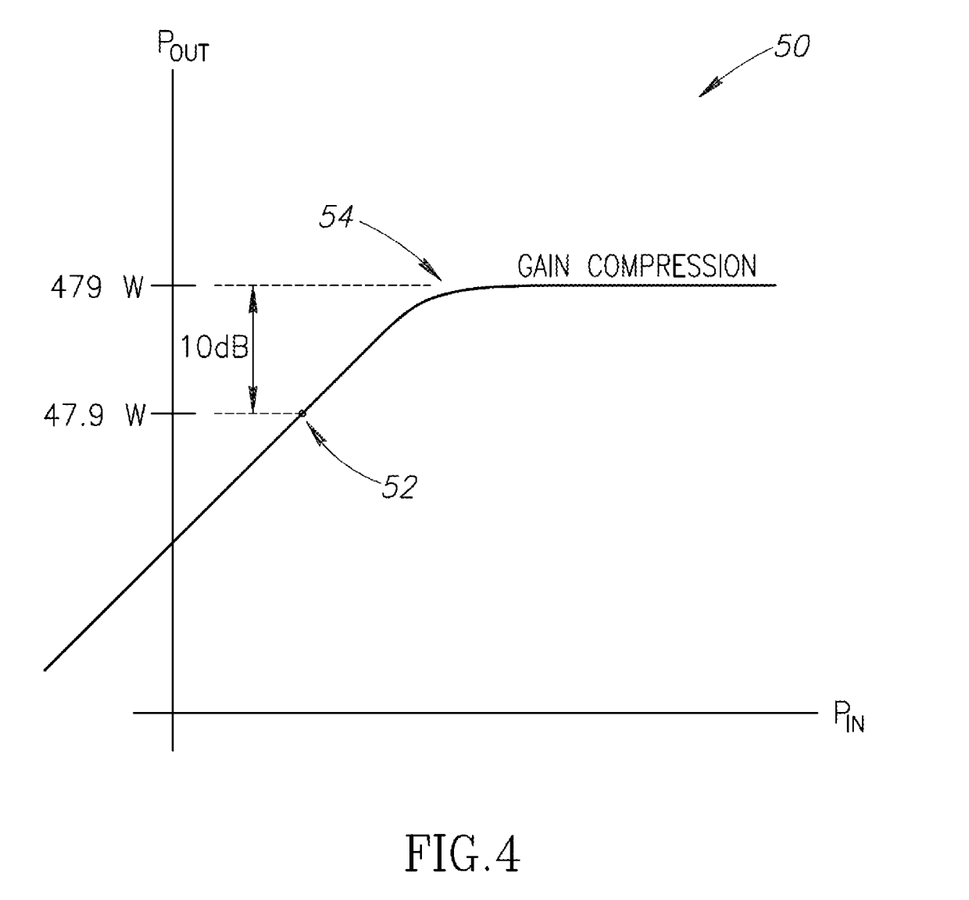
FIG. 4 is a graph illustrating a gain characteristic for a typical amplifier used in an RF transmitter.

The design "rule of thumb" for a Class A biasing scheme is that an amplifier biased to operate in the linear gain characteristic region 32 (see FIG. 2) must be backed-off by at least 10 dB from its maximum power, which is the gain compression point 36. FIG. 4 is a graph 50 that illustrates this concept for the example provided above. As calculated above, if the required peak power point 52 is 47.9 watts (46.8 dBm), then the gain compression point 54 of the amplifier must be at least 479 watts (56.8 dBm) to ensure operation in the Class A linear region. Thus, for an amplifier operating in the Class A region and outputting 15 watts of power, the gain compression point must be very high (e.g., 479 watts).

Power amplifiers are almost exclusively discrete transistors that are defined by their maximum output power (i.e., the output power at full gain compression), also called the "saturated limit." Higher saturated power requires greater physical die size. Thus, it is advantageous if a design enables an RF transmitter to use amplifiers having a relatively low maximum output power.

As an example, consider two RF power transistors available from the supplier Polyfet RF Devices, Camarillo, Calif., which employ the Linear-Diffuse Metal Oxide Semiconductor (LDMOS) fabrication process. A 70 watt LDMOS transistor, Polyfet LP702, has a component area (excluding solder tabs) of 0.1935 square inches. In contrast, a 300 watt LDMOS transistor, Polyfet LR301, has a component area of 0.5159 inches, nearly three times larger than the 70 watt transistor. Besides a larger component size, the 300 watt LDMOS transistor also requires proportionally more printed circuit board (PCB) space for solder lands, biasing, and impedance matching. Perhaps more importantly, the 300 watt transistor will dissipate more heat (discussed below) which requires a larger and more complicated heat-sinking solution. Thus, it is clear that it is advantageous to use an RF power transistor with a lower maximum output power if possible.

As discussed previously, an amplifier biased for Class A operation operates between 5% and 10% efficiency. For 8% efficiency, an amplifier delivering 15 watts of RF power (as required by the avionics specification) will require 187.5 watts of DC power. In comparison, an amplifier biased for Class AB will operate with around 30% efficiency, so that for 15 watts RF power, the required DC power is only about 50 watts. Avionics electronics systems provide specific DC voltages, one of them being +28V which may be used to supply DC power to a transmitter power amplifier. Using a 28V supply voltage, the Class A amplifier described above would require nearly 7 amperes of DC current, whereas the Class AB amplifier requires only 1.9 amperes of DC current. As can be appreciated, this design provides significant differences in the type and size of the DC power supply required to power the transmitter.

Continuing with the example above, the Class A amplifier providing 15 watts of RF power will require 187.5 watts of DC power and will thus have to dissipate 172.5 watts (187.5−15=172.5 watts) of heat. The Class AB amplifier providing 15 watts of RF power will require 50 watts of DC power and dissipates only 35 watts of heat. As discussed above, the transistor used to implement the Class AB amplifier may be much smaller than one needed to implement the Class A amplifier. This provides a significant difference in the mechanical design required to extract the heat from the transmitter, the radio associated with the transmitter, and the entire assembly in which the radio is installed.

The techniques of the present invention allow the power amplifier for an RF transmitter to be much smaller than would be required if the power amplifier was operated with Class A biasing. Because the transmitter uses the Cartesian feedback pre-distortion technology discussed above, the driver amplifier of the RF transmitter may also be operated with Class AB biasing, which reduces its size as well as the space for solder lands, biasing, and impedance matching.

As discussed above, the Cartesian Feed-back loop transmitter IC CMX998 was originally designed for low-power transmitter applications such as the cellular handset market. In this type of application, the peak power of the power amplifier is only 1 to 2 watts and the system gain is on the order of 30 dB. In an avionics application, the output power is considerably higher (e.g., 15 watts) and thus the system gain is greater. These differences have implications regarding the difficulty of controlling adjacent channel power (ACP) and wideband spurious noise, both of which are strictly limited by the avionics specification.

When there is only a moderate amount of system gain, as required for cellular handset applications, then the wideband noise floor of the CMX998 will not be increased very much. But if the active channel power output is high, as it is for avionics applications, then the larger gain will also increase the noise floor, possibly above allowable limits.

Since the CMX998 is used in a closed-loop feedback system, it is designed to internally drive its output power to the level that is required, given the system gain and the power required at the system output (i.e., the antenna). This is done with an internal attenuator. For example, if the required system output power is +33 dBm (2 watts) and the system gain is 35 dB, the CMX998 will respond by setting its output power to −2 dBm (−2 dBm+35 dB=+33 dBm output power). The wideband noise power for the CMX998 is specified as −148 dBc/Hz. Thus, for a system gain of 35 dB, the output wideband noise power in this example will be −115 dBm/Hz (e.g., +33 dBm−148 dBc/Hz=−115 dBm/Hz). If accounting for a channel bandwidth of 25 kHz for comparison, the noise power is −71 dBm (e.g., −115 dBm/Hz+10·log$_{10}$[25×10$^3$]=−71 dBm).

Figure 5:
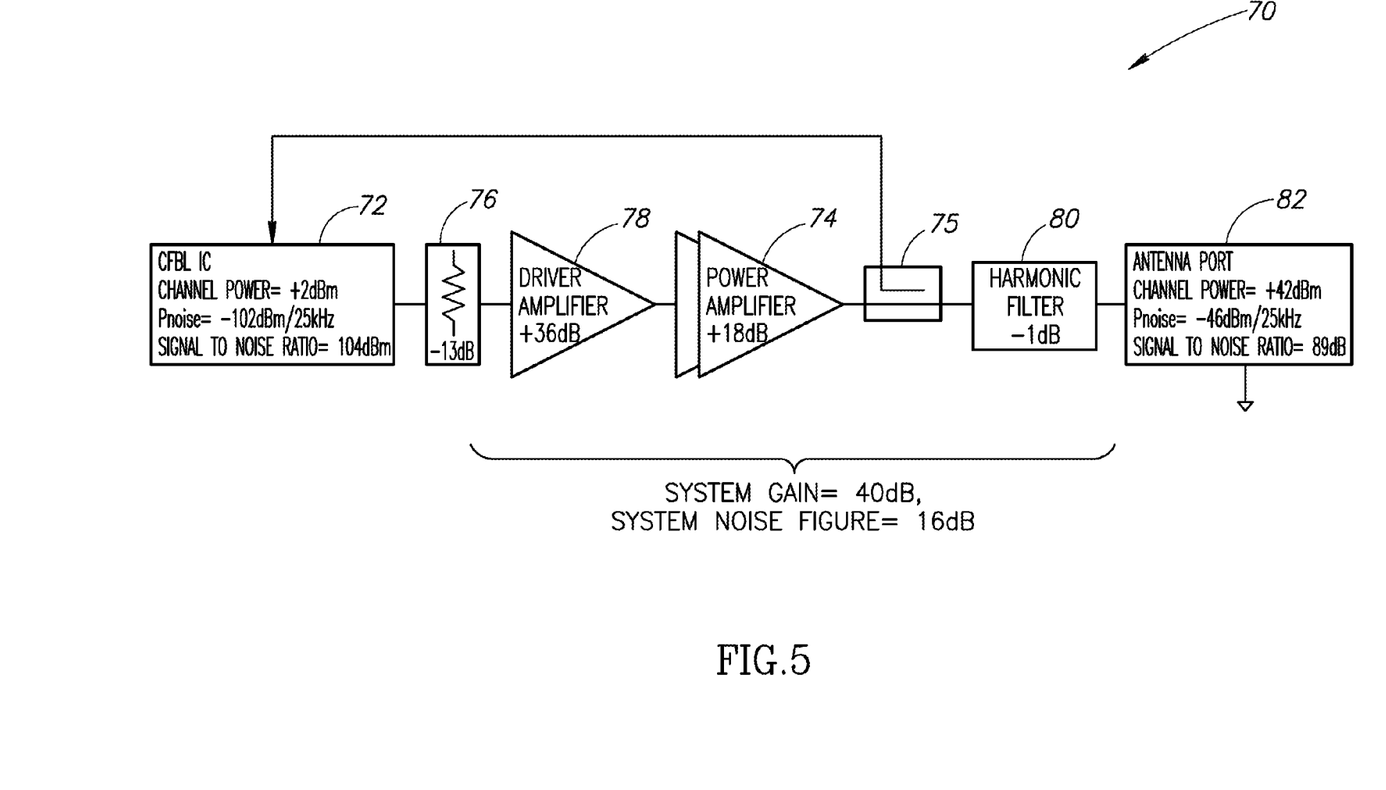
FIG. 5 is a block diagram of an RF transmitter in accordance with an embodiment of the present invention.

FIG. 5 illustrates a functional block diagram of an RF transmitter 70 that uses a Cartesian Feedback Loop (CFBL) IC 72 (e.g., the CMX998 discussed above) in a high-gain avionics application. Although the RF transmitter 70 uses Cartesian feedback to operate in the Class AB region, it does not perform as expected with regards to noise power. The RF transmitter 70 includes a power amplifier 74 coupled to an output or antenna port 82 through a harmonic filter 80. As an example, the power amplifier 74 may comprise the smaller 60 watt LDMOS transistor from Polyfet (LP702) discussed above. The input of the power amplifier 74 is driven by a driver amplifier 78, which is coupled to the CFBL IC 72 via a −13 dB interstage pad 76 (or "attenuation pad"). The CFBL IC 72 may receive its input signal from an input signal source (not shown), such as a modulator. A sample output of the power amplifier 74 is taken using a directional coupler 75 and is fed back to the CFBL IC 72 to close the feedback loop. The −13 dB interstage pad 76 is required to compensate for the excess gain of the driver amplifier 78 in order to meet the system output power requirement.

Typical power levels, gains, and losses of this high-gain application are shown in FIG. 5. Since the required system output power is much greater (+42 dBm) than required for the low power application, the required system gain is also much greater. This larger system gain tends to also increase the wideband noise power. A system gain of 40 dB will set the output power of the CFBL IC 72 to +2 dBm to provide an overall output power of +42 dBm, and its wideband noise is expected to be at −106 dBm/Hz, or −62 dBm/25 kHz using the same calculations as above.

However, when testing the RF transmitter 70 shown in FIG. 5, the transmitter did not meet the adjacent channel power (ACP) specifications set forth above in Table 1. In fact, the wideband noise power level was much higher. It was resolved that noise performance at the antenna output 82 is determined as much by the system noise figure as is typically the case for a receiver design. In this application, the −13 dB interstage pad 76 between the output of the CFBL IC 72 and the driver amplifier 78 determines the final noise power, not the native noise level of the CFBL IC 72 as initially expected. A noise figure analysis of the transmitter 70 predicts a noise power of −46 dBm/25 kHz at a 5 MHz offset.

Figure 6:
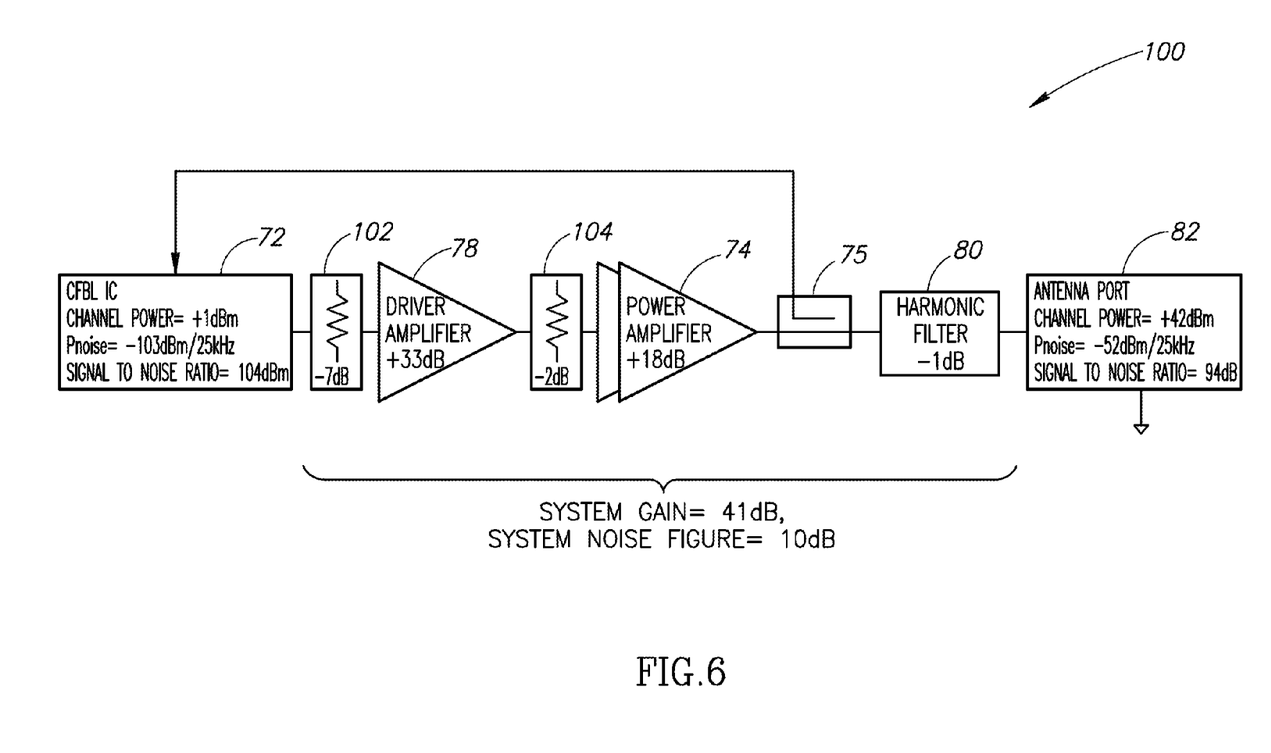
FIG. 6 is a block diagram of another RF transmitter in accordance with an embodiment of the present invention, configured to meet specified adjacent channel power requirements.

FIG. 6 illustrates a second version of an RF transmitter 100, similar to the transmitter 70 shown in FIG. 5. This version has a simulated noise power at a 5 MHz offset of −52 dBm/25 kHz, 6 dB lower than the noise power of the RF transmitter 70 shown in FIG. 5. In this configuration, some of the −13 dB interstage pad 76 (shown in FIG. 5) has been shifted to the output of the driver amplifier 78. As shown, the RF transmitter 100 of FIG. 6 includes a −7 dB interstage pad 102 at the input of the driver amplifier 78 and a −2 dB interstage pad 104 at the output of the driver amplifier. Thus the total attenuation by the interstage pads 102 and 104 is 9 dB, but may be more or less in other embodiments. Further, the driver amplifier 78 was also modified to lower its gain from +36 dB (see FIG. 5) to +33 dB (see FIG. 6). Not too much of the interstage pad 76 shown in FIG. 5 can be shifted to the output of the driver amplifier 78, nor can the gain of the driver amplifier be reduced too much, since both of these changes lower the saturation power limit of the driver, which should be kept high enough so that the system does not "limit out" at full power. With the modifications shown in FIG. 6, the RF transmitter 100 is able to meet the adjacent channel power (ACP) requirements shown in Table 1.

In addition to ACP requirements discussed above, RF transmitters for avionics applications are also required to meet stringent requirements for wideband spurious noise. The wideband spurious noise requirement addresses the transmitted noise power beyond the +/−1 MHz limits of the ACP requirements. The harmonic filter 80 after the power amplifier 74 sufficiently attenuates wideband spurious noise above the VHF data link band (i.e., above 118 MHz to 137 MHz), but there is no comparable filtering below the VHF data link band (i.e., below 118 MHz).

The avionics application specification (DO-281A) discussed above specifies the maximum allowable spurious energy in the FM radio band, which spans from 88 MHz to 108 MHz. In the FM band, emissions are not permitted above a level of −54 dBm/100 kHz, which is equivalent to −60 dBm/25 kHz. Even with the improvements provided above in the RF transmitter 100 shown in FIG. 6, the total noise power will be above this limit for spurious energy in the FM radio band. To solve this problem, a high-pass filter is utilized to pass the VHF data link band (i.e., 118 MHz-137 MHz) down to 118 MHz, and to attenuate signals in the FM radio band up to 108 MHz to sufficiently limit the spurious energy in the FM band.

Figure 7:
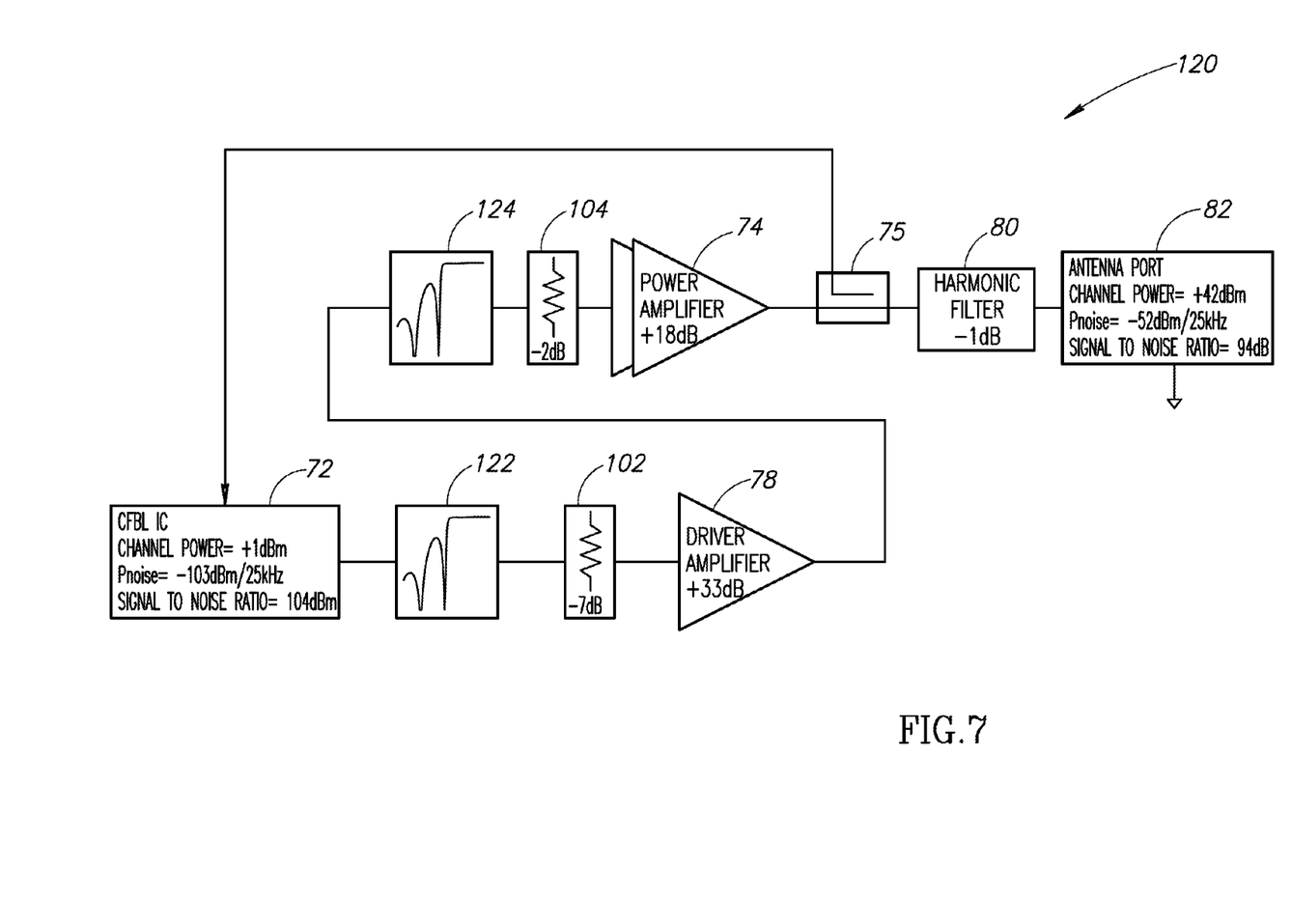
FIG. 7 is a block diagram of another RF transmitter in accordance with an embodiment of the present invention, configured to meet specified adjacent channel power and wideband spurious energy requirements.
Figure 8:
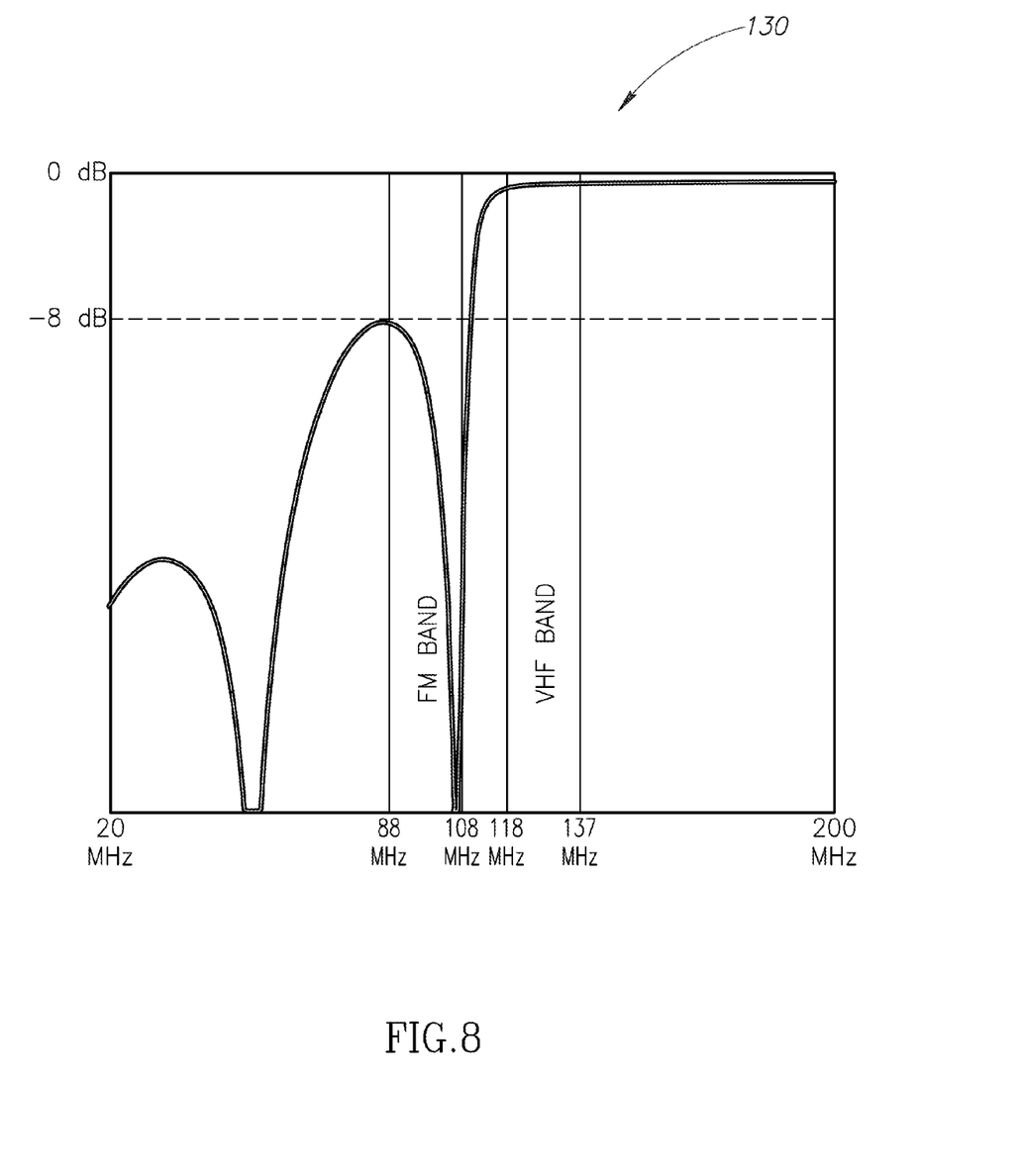
FIG. 8 is a graph illustrating the frequency response of a high-pass filter included in the RF transmitter shown in FIG. 6.

FIG. 7 illustrates a third version of an RF transmitter 120, similar to the transmitters 70 and 100 shown in FIGS. 5 and 6, respectively. As shown, two high-pass filters 122 and 124 have been added to the transmitter 120. The challenge is to design a filter with a high enough Q factor that it would not attenuate within the VHF data link band, 118 MHz to 137 MHz, but would have sufficient attenuation only 10 MHz below at 108 MHz, and would also fit within a relatively small space. It was determined that, rather than using a single filter alone, the two high pass filters 122 and 124 placed in series as shown in FIG. 7 resulted in a design that satisfied the requirement of the avionics specification for spurious energy in the FM radio band. The frequency response characteristic for these filters is shown in a graph 130 of FIG. 8. As shown, the filters 122 and 124 pass signals in the VHF data link band (between 118 MHz and 137 MHz) and attenuate signals in the FM radio band (between 88 MHz and 108 MHz).

One utility of using Cartesian feedback for RF transmitters in avionics applications is the improvement of the spectral efficiency of the transmitted signal while utilizing relatively small amplifiers, which in turn allows significant reduction in DC power consumption, heat dissipation, and size. The improved heat dissipation simplifies the mechanical design with regard to heat sinking requirements and size, which lowers cost and weight of the overall system. Table 2 below summarizes some of the estimated improvements in the mechanical aspects of a radio design due to the RF transmitters of the present invention. The values in Table 2 are derived from a comparison to another product which is intended to meet many of the same performance requirements described herein. The values also reflect some of the calculations presented above which compare the traditional open-loop architecture to the new Cartesian feedback solution of the present invention. It should be appreciated that these values are provided only as examples and actual improvements will depend on both the specific implementation of the present invention and the previous design to which it is compared.

TABLE 2

Estimated Improvements in the Mechanical Aspects of a Radio

| Feature | Savings |
| --- | --- |
| Required board space | 50% |
| Dissipated heat | 80% |
| Power | 75% |
| Heat sink size | 80% |
| Heat sink weight | 70% |
| Heat sink cost | 30% |
| Hardware assembly time | 50% |

It is noted that the size reduction is a benefit not only to the radio, but also to the entire assembly in which the radio is installed. Moreover, the size reduction also reduces the space required for installation in an instrument panel of an aircraft. The application of an integrated SoC implementing Cartesian feedback, with its inherent noise limitations, to the high-power, high-gain application wherein additional design features are required to limit wideband and spurious noise, is unique and innovative. By overcoming these limitations, significant power, efficiency, weight and volume improvements for RF transmitters used in avionics applications is achieved.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Accordingly, the invention is not limited except as by the appended claims.

The invention claimed is:

1. A radio frequency (RF) transmitter for use in an avionics system, comprising:
   a power amplifier having an input and an output, the power amplifier being configured to deliver at least 15 watts of output power to an antenna port;
   biasing circuitry operative to bias the power amplifier to operate in its Class AB region;
   an up-converter having an input and an output configured to provide an RF signal to the power amplifier;
   an error amplifier having a first input configured to receive an I/Q input signal, a second input, and an output, the output being the difference of the first input and the second input and being operatively coupled to the input of the up-converter;
   a driver amplifier having an input and an output, the input being operatively coupled to the output of the up-converter, the output being operatively coupled to the input of the power amplifier;
   a first interstage pad operatively coupled between the input of the driver amplifier and the output of the up-converter;
   a second interstage pad operatively coupled between the output of the driver amplifier and the input of the power amplifier; and
   a Cartesian feedback loop operatively coupled between the output of the power amplifier and the second input of the error amplifier.

2. The RF transmitter of claim 1, wherein the power amplifier comprises a transistor.

3. The RF transmitter of claim 1, further comprising:
   a high pass filter that is operative to suppress low-frequency wideband noise.

4. The RF transmitter of claim 3,
   wherein the high pass filter comprises:
   a first high pass filter operatively coupled between the output of the up-converter and the input of the driver amplifier; and
   a second high pass filter operatively coupled between the output of the driver amplifier and the input of the power amplifier.

5. The RF transmitter of claim 1, wherein the up-converter and the error amplifier are implemented in a single integrated circuit, and the power amplifier comprises a transistor.

6. The RF transmitter of claim 1, wherein the Cartesian feedback loop comprises a directional coupler operatively coupled to the output of the power amplifier.

7. The RF transmitter of claim 6, further comprising a down-converter operatively coupled between the directional coupler and the second input of the error amplifier.

8. The RF transmitter of claim 1, further comprising biasing circuitry operative to bias the driver amplifier so that it operates in its Class AB region.

9. A radio frequency (RF) transmitter for use in an avionics system, comprising:
   a power amplifier having an input and an output, the power amplifier comprising a transistor configured to deliver at least 15 watts of output power to an antenna port;
   biasing circuitry operative to bias the transistor to operate in its Class AB region;
   an up-converter having an input and an output, and being configured to provide an RF signal to the power amplifier;
   an error amplifier having a first input configured to receive an I/Q input signal, a second input, and an output, the output being the difference of the first input and the second input and being operatively coupled to the input of the up-converter;
   a driver amplifier having an input and an output;
   a first interstage pad operatively coupled between the input of the driver amplifier and the output of the up-converter;
   a second interstage pad operatively coupled between the output of the driver amplifier and the input of the power amplifier; and
   a Cartesian feedback loop operatively coupled between the output of the power amplifier and the second input of the error amplifier.

10. The RF transmitter of claim 9, further comprising:
    a first high pass filter operatively coupled between the output of the up-converter and the first interstage pad; and
    a second high pass filter operatively coupled between the output of the driver amplifier and the second interstage pad.

11. The RF transmitter of claim 10, wherein the first and second high pass filters are operative to attenuate wideband spurious signals and noise below the RF transmitter's operating band.

12. A radio frequency (RF) transmitter for use in an avionics system, comprising:
    a power amplifier having an input and an output, the power amplifier being configured to deliver at least 15 watts of output power to an antenna port;
    biasing circuitry operative to bias the power amplifier to operate in its Class AB region;
    a directional coupler operatively coupled to the output of the power amplifier;
    an integrated circuit comprising:
       an up-converter having an input and an output, the output being operatively coupled to the input of the power amplifier and configured to provide an RF signal to the power amplifier;
       an error amplifier having a first input configured to receive an I/Q input signal, a second input, and an output, the output being the difference of the first input and the second input and being operatively coupled to the input of the up-converter;
       a down-converter operatively coupled between the directional coupler and the second input of the error amplifier; and
       a Cartesian feedback loop operatively coupled between the output of the power amplifier and the second input of the error amplifier;
    driver amplifier having an input and an output, the input being operatively coupled to the output of the up-converter of the integrated circuit, the output being operatively coupled to the input of the power amplifier;
    a first interstage pad operatively coupled between the input of the driver amplifier and the output of the up-converter of the integrated circuit; and
    a second interstage pad operatively coupled between the output of the driver amplifier and the input of the power amplifier.

13. The RF transmitter of claim 12, further comprising a high pass filter operative to attenuate signals below the RF transmitter's operating band and to pass signals within the RF transmitter's operating band.

14. The RF transmitter of claim 13, wherein the high pass filter comprises:
    a first high pass filter operatively coupled between the output of the up-converter and the input of the driver amplifier; and
    a second high pass filter operatively coupled between the output of the driver amplifier and the input of the power amplifier.

15. A radio frequency (RF) transmitter for use in an avionics system, comprising:
    a power amplifier having an input and an output, the power amplifier being configured to deliver at least 15 watts of output power to an antenna port;
    biasing circuitry operative to bias the power amplifier to operate in its Class AB region;
    an up-converter having an input and an output configured to provide an RF signal to the power amplifier;
    an error amplifier having a first input configured to receive an I/Q input signal, a second input, and an output, the output being the difference of the first input and the second input and being operatively coupled to the input of the up-converter;
    a driver amplifier having an input and an output, the input being operatively coupled to the output of the up-converter, the output being operatively coupled to the input of the power amplifier;
    a high pass filter that is operative to suppress low-frequency wideband noise, wherein the high pass filter comprises a first high pass filter operatively coupled between the output of the up-converter and the input of the driver amplifier, and a second high pass filter operatively coupled between the output of the driver amplifier and the input of the power amplifier; and
    a Cartesian feedback loop operatively coupled between the output of the power amplifier and the second input of the error amplifier.

16. The RF transmitter of claim 15, wherein the power amplifier comprises a transistor.

17. The RF transmitter of claim 15, wherein the up-converter and the error amplifier are implemented in a single integrated circuit.

18. The RF transmitter of claim 15, wherein the Cartesian feedback loop comprises a directional coupler operatively coupled to the output of the power amplifier.

19. The RF transmitter of claim 18, further comprising a down-converter operatively coupled between the directional coupler and the second input of the error amplifier.

20. The RF transmitter of claim 15, further comprising biasing circuitry operative to bias the driver amplifier so that it operates in its Class AB region.

21. A radio frequency (RF) transmitter for use in an avionics system, comprising:
   a power amplifier having an input and an output, the power amplifier being configured to deliver at least 15 watts of output power to an antenna port;
   biasing circuitry operative to bias the power amplifier to operate in its Class AB region;
   a directional coupler operatively coupled to the output of the power amplifier;
   an integrated circuit comprising:
      an up-converter having an input and an output, the output being operatively coupled to the input of the power amplifier and configured to provide an RF signal to the power amplifier;
      an error amplifier having a first input configured to receive an I/Q input signal, a second input, and an output, the output being the difference of the first input and the second input and being operatively coupled to the input of the up-converter;
      a down-converter operatively coupled between the directional coupler and the second input of the error amplifier; and
      a Cartesian feedback loop operatively coupled between the output of the power amplifier and the second input of the error amplifier; and
   a high pass filter operative to attenuate signals below the RF transmitter's operating band and to pass signals within the RF transmitter's operating band, wherein the high pass filter comprises a first high pass filter operatively coupled between the output of the up-converter and the input of the driver amplifier, a second high pass filter operatively coupled between the output of the driver amplifier and the input of the power amplifier.

22. A radio frequency (RF) transmitter for use in an avionics system, comprising:
   a power amplifier having an input and an output, the power amplifier being configured to deliver at least 15 watts of output power to an antenna port;
   an up-converter having an input and an output configured to provide an RF signal to the power amplifier;
   an error amplifier having a first input, a second input, and an output, the output being the difference of the first input and the second input and being operatively coupled to the input of the up-converter;
   a driver amplifier having an input and an output, the input being operatively coupled to the output of the up-converter, the output being operatively coupled to the input of the power amplifier;
   a first high pass filter operatively coupled between the output of the up-converter and the input of the driver amplifier;
   a second high pass filter operatively coupled between the output of the driver amplifier and the input of the power amplifier; and
   a feedback loop operatively coupled between the output of the power amplifier and the second input of the error amplifier.

23. A radio frequency (RF) transmitter for use in an avionics system, comprising:
   a power amplifier having an input and an output, the power amplifier being configured to deliver at least 15 watts of output power to an antenna port;
   an up-converter having an input and an output configured to provide an RF signal to the power amplifier;
   an error amplifier having a first input, a second input, and an output, the output being the difference of the first input and the second input and being operatively coupled to the input of the up-converter;
   a driver amplifier having an input and an output, the input being operatively coupled to the output of the up-converter, the output being operatively coupled to the input of the power amplifier;
   a first interstage pad operatively coupled between the input of the driver amplifier and the output of the up-converter;
   a second interstage pad operatively coupled between the output of the driver amplifier and the input of the power amplifier; and
   a feedback loop operatively coupled between the output of the power amplifier and the second input of the error amplifier.

* * * * *